(12) United States Patent
Yatsuda et al.

(10) Patent No.: US 8,685,267 B2
(45) Date of Patent: Apr. 1, 2014

(54) SUBSTRATE PROCESSING METHOD

(75) Inventors: Koichi Yatsuda, Tokyo (JP); Hiromasa Mochiki, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 161 days.

(21) Appl. No.: 13/165,951

(22) Filed: Jun. 22, 2011

(65) Prior Publication Data
US 2011/0318933 A1 Dec. 29, 2011

Related U.S. Application Data

(60) Provisional application No. 61/365,591, filed on Jul. 19, 2010.

(30) Foreign Application Priority Data

Jun. 23, 2010 (JP) ................................. 2010-142740

(51) Int. Cl.
*B44C 1/22* (2006.01)
(52) U.S. Cl.
USPC .................. 216/67; 216/68; 216/71; 438/714
(58) Field of Classification Search
USPC .................. 216/67, 68, 71; 438/714
See application file for complete search history.

(56) References Cited

U.S. PATENT DOCUMENTS

2009/0047795 A1* 2/2009 Matsudo et al. ............... 438/729
2010/0130018 A1* 5/2010 Tokashiki et al. ............. 438/710
2010/0248488 A1* 9/2010 Agarwal et al. ............... 438/714

FOREIGN PATENT DOCUMENTS

CN          101542691 A       9/2009
JP          2000-311890 A     11/2000
WO          2008/063836 A1    5/2008

OTHER PUBLICATIONS

Wikipedia The Free Encyclopedia; Plasma, http://en.wikipedia.org/wiki/Plasma_(physics); pp. 1-18, 2013.*

* cited by examiner

*Primary Examiner* — Binh X Tran
(74) *Attorney, Agent, or Firm* — Pearne & Gordon LLP

(57) ABSTRACT

There is provided a substrate processing method capable of preventing the decrease in etching efficiency by positive ions and increasing the overall etching efficiency by using negative ions. The substrate processing method includes applying a plasma RF and a bias RF in the pattern of a pulse wave, respectively. The substrate processing method repeatedly performs the steps of: (3b) etching a substrate by positive ions in plasma by applying both the plasma RF and the bias RF; (3c) generating negative ions in a processing chamber by stopping the application of both the plasma RF and the bias RF; and (3a) attracting the negative ions to the substrate by applying the bias RF and stopping the application of the plasma RF. A duty ratio of the bias RF is set to be greater than a duty ratio of the plasma RF.

15 Claims, 6 Drawing Sheets

SUBSTRATE PROCESSING METHOD

CROSS-REFERENCE TO RELATED APPLICATION

This application claims the benefit of Japanese Patent Application No. 2010-142740 filed on Jun. 23, 2010, and U.S. Provisional Application Ser. No. 61/365,591 filed on Jul. 19, 2010, the entire disclosures of which are incorporated herein by reference.

FIELD OF THE INVENTION

The present disclosure relates to a substrate processing method for generating a plasma by applying a high frequency power for plasma generation and a high frequency power for biasing in a pattern of a pulse wave and for performing a predetermined etching process on a substrate by using the plasma.

BACKGROUND OF THE INVENTION

When a wiring process or the like is performed on a substrate such as a semiconductor wafer, it is required to perform a fine process on the substrate and, thus, a substrate processing method using a plasma has been widely employed.

This substrate processing method uses a technique for generating a plasma in a pattern of a pulse wave in order to meet the requirement for accuracy of a processed shape or the like in a RIE (Reactive Ion Etching) process. By generating a plasma in the pattern of a pulse wave, it is possible to properly control dissociation state of a plasma generating gas. Accordingly, over-etching can be suppressed, and a fine process can be performed.

Recently, there is suggested a synchronous pulse control that combines a technique for generating a plasma in the pattern of a pulse wave by applying a high frequency power for plasma generation (hereinafter, referred to as "source RF") in the pattern of a pulse wave and a technique for controlling attraction of positive ions in the plasma in the pattern of a pulse wave by applying a high frequency power for biasing (hereinafter, referred to as "bias RF") in the pattern of a pulse wave (see, e.g., Patent Document 1).

Patent Document 1: Japanese Patent Laid-open Publication No. 2000-311890

However, in the reactive ion etching process, when attracting positive ions in the plasma to the semiconductor wafer, positive ions 72 may remain at a bottom of a hole 71 formed in a target film 70 as shown in FIG. 7. The remaining positive ions 72 may electrically prevent other positive ions 73 from reaching the bottom of the hole 71, so that the path of the other positive ions 73 in the hole 71 may be changed. Accordingly, the hole 71 is deformed, which results in the decrease in the etching efficiency by the positive ions.

Meanwhile, in the synchronous pulse control type plasma etching, after the application of the source RF is stopped (OFF), deactivated electrons that have lost energy in the plasma may adhere to electrically neutral molecules, atoms, or radicals, so that negative ions are generated. Therefore, it can be considered to increase the etching efficiency by using the negative ions in order to electrically neutralize the positive ions remaining at the bottom of the hole 71.

BRIEF SUMMARY OF THE INVENTION

In view of the above, the present disclosure provides a substrate processing method capable of suppressing the decrease in the positive ion etching efficiency and increasing the overall etching efficiency by effectively using negative ions.

In order to solve the above-described problems, in accordance with an aspect of the present disclosure, there is provided a substrate processing method performed by a substrate processing apparatus including a processing chamber for generating therein a plasma; a mounting table, provided in the processing chamber, for mounting thereon a substrate; and an electrode disposed to face the mounting table. The substrate processing method performs a plasma etching process on the substrate by applying to the processing chamber a high frequency power for plasma generation and applying to the mounting table a high frequency power for biasing, having a frequency lower than a frequency of the high frequency power for plasma generation. Further, the substrate processing method includes applying the high frequency power for plasma generation and the high frequency power for biasing in the pattern of a pulse wave, respectively; etching the substrate by positive ions in the plasma by applying both the high frequency power for plasma generation and the high frequency power for biasing; generating negative ions in the processing chamber by stopping the application of both the high frequency power for plasma generation and the high frequency power for biasing; and attracting the negative ions to the substrate by applying the high frequency power for biasing and stopping the application of the high frequency power for plasma generation. Here, a duty ratio of the high frequency power for biasing is set to be greater than a duty ratio of the high frequency power for plasma generation.

Further, the duty ratio of the high frequency power for biasing may be about 0.7 to about 0.8, and the duty ratio of the high frequency power for plasma generation may be about 0.5 to about 0.6.

Moreover, etching the substrate by positive ions may be performed for about ½ period of the pulse wave or more.

Furthermore, generating negative ions may be performed for about ¼ period of the pulse wave or more.

Further, generating negative ions may be performed for about 10 μsec to about 30 μsec.

Etching the substrate by positive ions, generating negative ions, and attracting the negative ions may be repeated in that order.

In accordance with the present disclosure, since the duty ratio of the high frequency power for biasing is greater than that of the high frequency power for plasma generation, the negative ion attraction process can be performed after performing the positive ion etching process for enough time. Thus, the decrease in the etching efficiency by the positive ions may be prevented and the overall etching efficiency can be increased by effectively using the negative ions.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described in detail with reference to the accompanying drawings.

Figure 1:
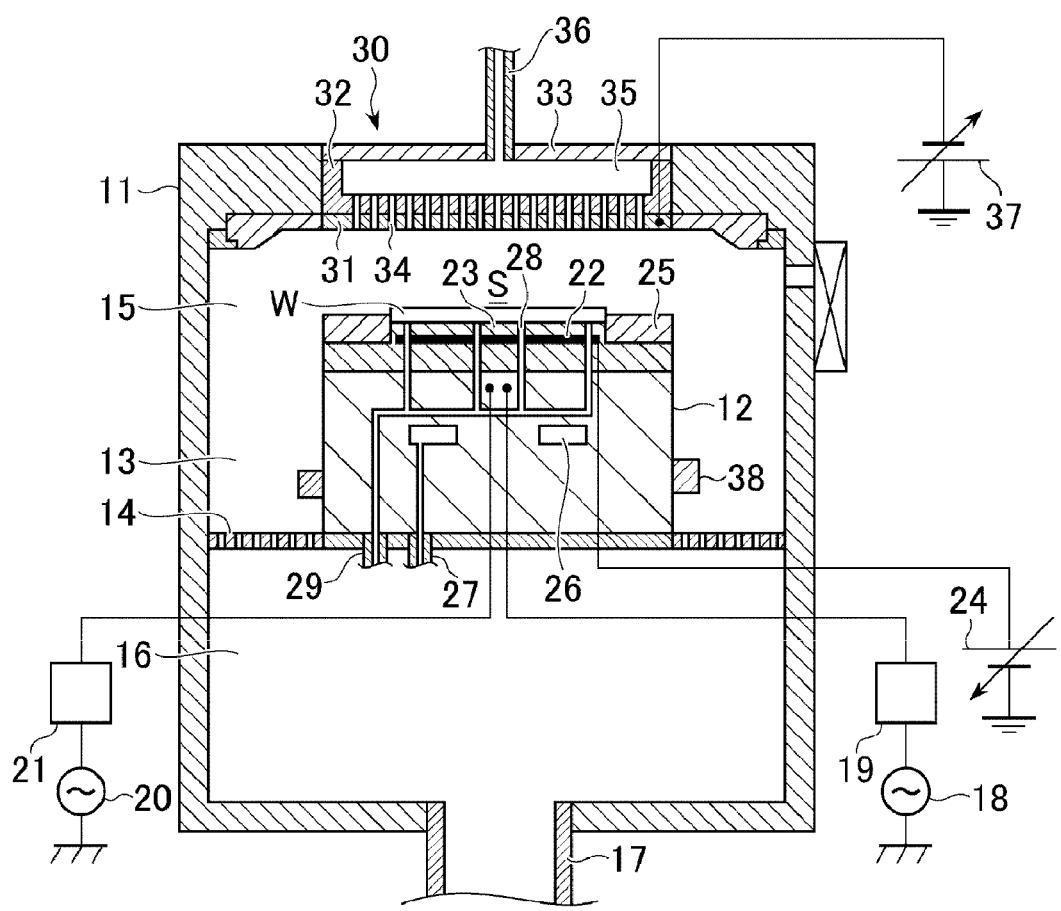
FIG. 1 is a cross sectional view showing a schematic configuration of a substrate processing apparatus for performing a substrate processing method in accordance with an embodiment of the present disclosure.

FIG. 1 is a cross sectional view showing a schematic configuration of a substrate processing apparatus for performing a substrate processing method in accordance with an embodiment of the present disclosure. The substrate processing apparatus performs a predetermined plasma etching process on a substrate.

In FIG. 1, the substrate processing apparatus 10 includes a chamber 11 for accommodating therein a semiconductor wafer W (hereinafter, referred to as "wafer"), and a cylindrical susceptor 12 for mounting thereon the wafer W is installed within the chamber 11. A side exhaust path 13 is formed by an inner sidewall of the chamber 11 and a side surface of the susceptor 12. A gas exhaust plate 14 is installed on the way of the side exhaust path 13.

The gas exhaust plate 14 is a plate-shaped member having a multiple number of through holes and serves as a partition plate for partitioning the inside of the chamber into an upper region and a lower region. In the upper region (hereinafter, referred to as "processing chamber") 15 of the inside of the chamber 11 partitioned by the gas exhaust plate 14, plasma is generated as described below. Further, a gas exhaust pipe 17 for exhausting a gas of the inside of the chamber 11 is connected to the lower region (hereinafter, referred to as "exhaust chamber (manifold)") 16 of the inside of the chamber 11. The gas exhaust plate confines or reflects the plasma generated in the processing chamber 15 so as to prevent a leakage of the plasma into the manifold 16.

A TMP (Turbo Molecular Pump) (not shown) and a DP (Dry Pump) (not shown) are connected to the gas exhaust pipe 17, and these pumps exhaust the inside of the chamber 11 so as to depressurize the inside of the chamber 11 to a predetermined pressure level. Further, a pressure within the chamber 11 is controlled by an APC value (not shown).

The susceptor 12 within the chamber 11 is connected to a first high frequency power supply 18 and a second high frequency power supply 20 via a first matching unit 19 and a second matching unit 21, respectively. The first high frequency power supply 18 applies a high frequency power having a relatively low frequency of, e.g., about 2 MHz for biasing (hereinafter, referred to as "bias RF") to the susceptor 12, and the second high frequency power supply 20 applies a high frequency power having a relatively high frequency of, e.g., about 60 MHz for plasma generation (hereinafter, referred to as "source RF") to the susceptor 12. Accordingly, the susceptor 12 serves as an electrode. Further, the first matching unit 19 and the second matching unit 21 may reduce reflection of the high frequency power from the susceptor 12 to thereby maximize the application efficiency of the high frequency power to the susceptor 12.

Provided on an upper portion of the susceptor 12 is an electrostatic chuck (ESC) 23 having therein an electrostatic electrode plate 22. The electrostatic chuck 23 has a step-shaped portion and is made of ceramics.

A DC power supply 24 is connected to the electrostatic electrode plate 22. If a positive DC voltage is applied to the electrostatic electrode plate 22, a negative potential is generated on a surface (hereinafter, referred to as "rear surface") of the wafer W on the side of the electrostatic chuck 23, so that a potential difference is generated between the electrostatic electrode plate 22 and the rear surface of the wafer W. Accordingly, the wafer W is attracted to and held on the electrostatic chuck 23 by a Coulomb force or a Johnsen-Rahbek force caused by the potential difference.

Further, a focus ring 25 is mounted on a horizontal portion of the step-shaped portion of the electrostatic chuck 23 so as to surround the wafer W attracted to and held on the electrostatic chuck 23. The focus ring 25 is made of, for example, Si or silicon carbide (SiC).

Formed within the susceptor 12 is, for example, an annular coolant path 26 extended in, e.g., a circumferential direction of the susceptor 12. A low temperature coolant such as cooling water or Galden (registered trademark) is supplied into and circulated through the coolant path 26 from a chiller unit (not shown) via a coolant line 27. The susceptor 12 cooled by the coolant cools the wafer W and the focus ring 25 via the electrostatic chuck (ESC) 23.

A multiple number of heat transfer gas supply holes is opened at a portion (hereinafter, referred to as "attraction surface") of the electrostatic chuck 23 on which the wafer W is attracted and held. The heat transfer gas supply holes 28 are connected with a heat transfer gas supply unit (not shown) via a heat transfer gas supply line 29. The heat transfer gas supply unit supplies a He (helium) gas as a heat transfer gas into a gap between the attraction surface and the rear surface of the wafer W via the heat transfer gas supply holes 28. The He gas supplied into the gap between the attraction surface and the rear surface of the wafer W transfers the heat of the wafer W to the electrostatic chuck 23 effectively.

A shower head 30 is provided at a ceiling portion of the chamber 11 so as to face the susceptor 12 via a processing space S of the processing chamber 15. The shower head 30 includes an upper electrode plate 31; a cooling plate 32 for supporting the upper electrode plate 31 detachably installed thereto; and a cover 33 for covering the cooling plate 32. The upper electrode plate 31 is formed of a circular plate-shaped member having a number of gas holes 34 formed through the upper electrode plate 31 in its thickness direction, and the upper electrode plate 31 is made of a semiconductor material such as silicon carbide (SiC) or silicon (Si). Further, a buffer room 35 is formed within the cooling plate 32, and the buffer room 35 is connected to a processing gas introduction line 36.

A DC power supply 37 is connected to the upper electrode plate 31 of the shower head 30, and a negative DC voltage is applied to the upper electrode plate 31. In this case, the upper electrode plate 31 emits secondary electrons and prevents a decrease of an electron density on the wafer W within the processing chamber 15. The emitted secondary electrons may move from on the wafer W to a ground electrode (ground ring) 38 made of a semiconductor material such as silicon carbide (SiC) or silicon (Si). The ground electrode 38 is positioned to surround the side surface of the susceptor 12 in the side exhaust path 13.

In the substrate processing apparatus 10 configured as stated above, the processing gas supplied from the processing gas introduction line 36 into the buffer room 35 is introduced into the processing chamber 15 via the gas holes 34 of the upper electrode plate 31, and the introduced processing gas is excited into plasma by the source RF applied to the inside of the processing chamber 15 from the second high frequency power supply 20 via the susceptor 12. Positive ions in the plasma are attracted toward the wafer W by the bias RF supplied from the first high frequency power supply 18 to the susceptor 12 and a plasma etching process is performed on the wafer W.

An operation of each component of the substrate processing apparatus 10 is controlled by a CPU of a control unit (not shown) included in the substrate processing apparatus 10 according to a program associated with the plasma etching process.

The pulse control type substrate processing method using the above-described substrate processing apparatus may employ (1) synchronous pulse control in which a phase of a pulse wave of a source RF and a phase of a pulse wave of a bias RF are not different from each other, (2) pulse control in which a phase of a pulse wave of a bias RF is shifted backward with respect to a phase of a pulse wave of a source RF, and (3) pulse control in which a phase of a pulse wave of a bias RF is shifted forward with respect to a phase of a pulse wave of a source RF.

Figure 2A:
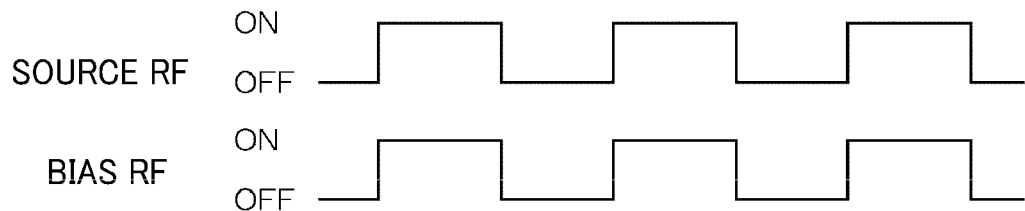
FIGS. 2A to 2C illustrate various types of control processes in a pulse control type substrate processing method.
Figure 2B:
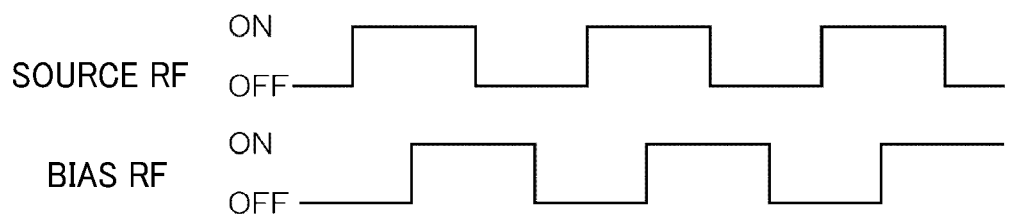
Figure 2C:
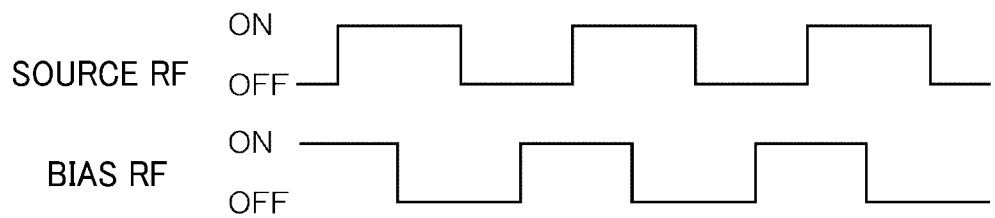

FIGS. 2A to 2C illustrate various types of control processes in the pulse control type substrate processing method. FIG. 2A shows the case in which the phase of the pulse wave of the source RF and the phase of the pulse wave of the bias RF are not different from each other. FIG. 2B shows the case in which the phase of the pulse wave of the bias RF is shifted backward by about ¼ period with respect to the phase of the pulse wave of the source RF. FIG. 2C shows the case in which the phase of the pulse wave of the bias RF is shifted forward by about ¼ period with respect to the phase of the pulse wave of the source RF.

Referring to FIG. 2A, the phase of the pulse wave of the source RF is synchronized with the phase of the pulse wave of the bias RF, so that the source RF and the bias RF are simultaneously turned ON and OFF. Hence, when the source RF is turned ON, the positive ions are attracted to the wafer W by the bias RF, and a high-efficiency etching by the positive ions is performed. In this case, the negative ions are generated after the source RF is turned OFF. Since, however, the bias RF is also turned OFF, the negative ions are not attracted to the wafer W even though they exist in the plasma. Accordingly, the positive ions remaining at the bottom portion of the hole cannot be electrically neutralized.

Referring to FIG. 2B, the phase of the pulse wave of the bias RF is shifted backward by about ¼ period with respect to the phase of the pulse wave of the source RF. In such a case, the control for turning ON the bias RF after turning ON the source RF, and then, for turning OFF the bias RF after turning OFF the source RF is repeatedly performed. In this case, high-efficiency etching by the positive ions is performed in a state where both the source RF and the bias RF are turned ON; intermediate-efficiency etching by the positive ions attracted by the bias RF is performed in a state where the source RF is turned OFF and the bias RF is turned ON; and low-efficiency etching by the positive ions attracted by a self-bias voltage generated on the susceptor 12 by the source RF is performed in a state where the source RF is turned ON and the bias RF is turned OFF. However, when the negative ions are generated after the source RF is turned OFF, the bias RF is turned OFF, thereby preventing the negative ions from being attracted to the wafer W. Accordingly, the positive ions remaining at the bottom of the hole cannot be electrically neutralized. Further, the duration of the high-efficiency etching by the positive ions is decreased as compared to that in the case of FIG. 2A, so that the etching efficiency is decreased as compared to that in the case of FIG. 2A.

Next, referring to FIG. 2C, the phase of the pulse wave of the bias RF is shifted forward by about ¼ period with respect to the phase of the pulse wave of the source RF, and the control for turning ON the source RF for plasma generation after turning ON the bias RF, and then, for turning OFF the source RF after turning OFF the bias RF is repeatedly performed. In that case, high-efficiency etching by the positive ions is performed in a state where the source RF and the bias RF are turned ON, and low-efficiency etching by the positive ions attracted by the self-bias voltage is performed in a state where the source RF is turned ON and the bias RF is turned OFF. Moreover, when the negative ions are generated after the source RF is turned OFF, a bias RF corresponding to a next pulse wave is turned ON. Therefore, the negative ions in the plasma are attracted to the wafer by the bias RF.

In other words, referring to FIG. 2C, although the positive ions can be electrically neutralized by the negative ions, the duration of the high-efficiency etching by the positive ions is decreased as compared to that in the case of FIG. 2A. Hence, the overall etching efficiency may be decreased as compared to that in the case of FIG. 2A.

The present inventors have researched the movement of the negative ions, the timing for turning ON and OFF the source RF and the bias RF, and the like in order to improve the overall etching efficiency by effectively using the negative ions generated in the plasma. As a result, the present inventors have found out that the etching efficiency can be increased by effectively using the negative ions. In detail, the negative ions can be effectively used by the steps of: performing a positive ion etching process in which the high frequency power for plasma generation and the high frequency power for biasing are applied in the pattern of pulse waves; a negative ion generation process in which the application of the high frequency power for plasma generation and the high frequency power for biasing is stopped; and a negative ion attraction process in which the negative ions are attracted to the substrate by applying only the high frequency power for biasing. In this case, the duty ratio of the high frequency power for biasing may be set to be greater than that of the high frequency power for plasma generation.

Figure 3:
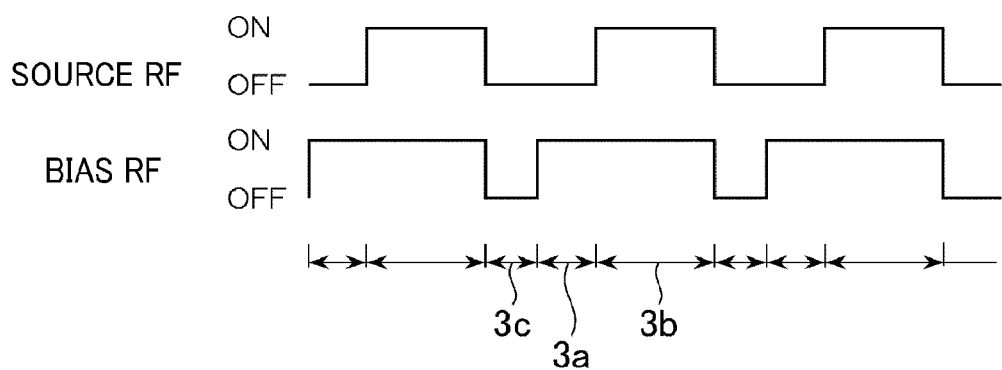
FIG. 3 shows a control process of a substrate processing method in accordance with an embodiment of the present disclosure.

FIG. 3 shows control processes of a substrate processing method in accordance with an embodiment of the present disclosure.

Referring to FIG. 3, the source RF and the bias RF in the pattern of pulse waves are applied. Further, a negative ion attraction process 3a in which only the bias RF is applied (ON) follows a negative ion generation process 3c in which the application of the source RF and the bias RF is stopped (OFF). Moreover, a positive ion etching process 3b in which the source RF and the bias RF are turned ON follows the negative ion attraction process 3a. The negative ion generation process 3c, the negative ion attraction process 3a and the positive ion etching process 3b are repeated in that order.

First of all, the negative ion generation mechanism in the negative ion generation process 3c will be described in detail.

Figure 4:
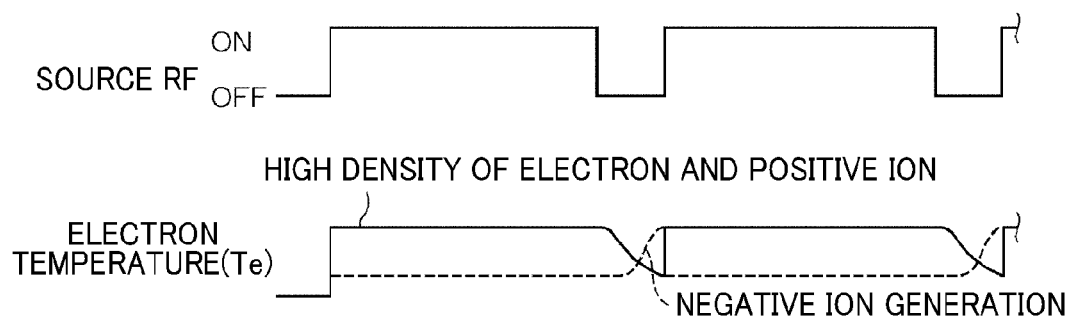
FIG. 4 is an explanatory diagram showing a negative ion generation mechanism.

FIG. 4 is an explanatory diagram showing the negative ion generation mechanism. In a lower graph of FIG. 4, a solid line indicates an electron temperature Te, and a dashed line indicates a density of negative ions.

Referring to FIG. 4, when the source RF is switched from OFF to ON (from the negative ion attraction process 3a of FIG. 3 to the positive ion etching process 3b), the plasma is generated. Then, the electron temperature Te in the processing chamber is increased, and the density of the electrons and the positive ions is increased. Accordingly, the high-efficiency etching by the positive ions is performed in a state where the density of the electrons and the positive ions is high.

The plasma mainly contains electrons, positive ions and radicals which are generated from the processing gas. However, when the source RF is turned OFF upon completion of the positive ion etching process 3b, the electrons may lose energy and the electron temperature may be decreased. Further, the electrons that have lost energy and have been deactivated due to the decrease of the electron temperature cannot exist independently, and thus adhere to electrically neutral molecules, atoms, or radicals floating in the processing chamber 15. Accordingly, negative ions such as F−, CF− or the like, are generated. Thus, the plasma becomes an ion-ion plasma in which both of positive ions and negative ions exist.

The electrons may adhere to the molecules or the radicals when colliding with the molecules or the radicals. Therefore, the negative ion generation speed may be slow, and the negative ions may be gradually generated after the source RF is turned OFF. If a certain time, e.g., about 10 μsec to about 30 μsec, does not elapse after the source RF is turned OFF, the density of the negative ions that can be attracted to the wafer W may be low despite that the bias RF is turned ON. Hence, the positive ions cannot be electrically neutralized. Therefore, in the present embodiment, a bias RF corresponding to a next pulse wave is turned ON when the density of the negative ions becomes high after a certain time elapses from turning OFF the source RF.

Hereinafter, the negative ion attraction process 3a of the present embodiment will be described in detail.

Upon completing the negative ion generation process in which the source RF and the bias RF are turned OFF, the negative ion attraction process 3a in which only the bias RF that does not contribute to the plasma generation is turned ON is performed. In the negative ion attraction process 3a, since the source RF is OFF state, a self-bias voltage by the source RF may not be generated. Therefore, the bias RF mainly generates the bias voltage which can attract the negative ions, and the bias voltage oscillates between a plus voltage and a minus voltage with respect to a zero-voltage baseline.

Figure 5:
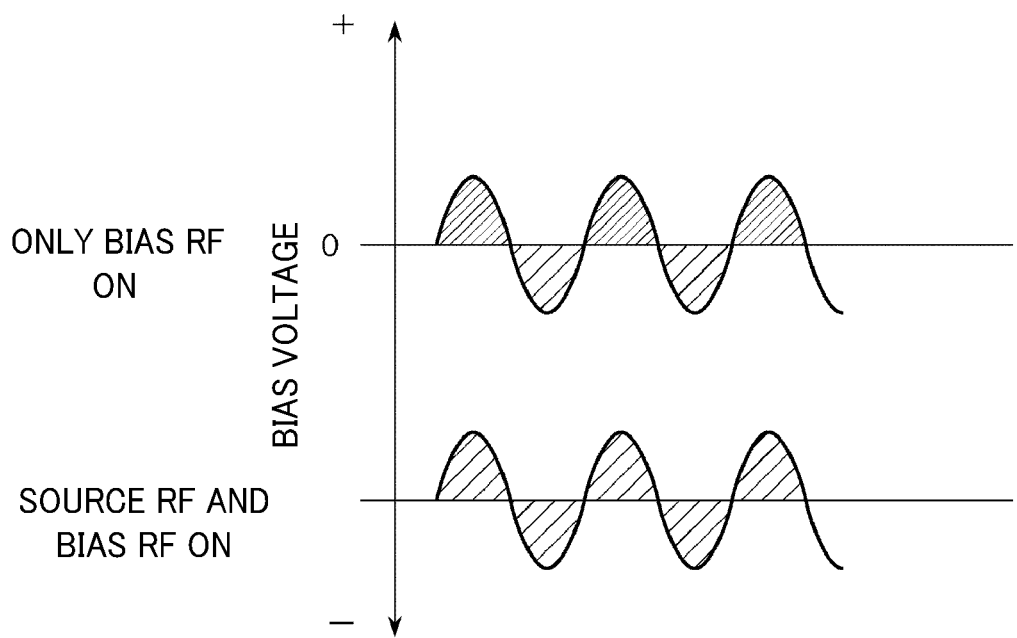
FIG. 5 is a graph showing changes of a bias voltage during a negative ion attraction process in comparison with those of a bias voltage during a positive ion etching process.

FIG. 5 is a graph showing changes in the bias voltage during the negative ion attraction process 3a in comparison with those in the bias voltage during the positive ion etching process 3b.

Referring to FIG. 5, when the plasma etching process is performed by applying the source RF and the bias RF (the lower graph of FIG. 5), the electron temperature in the processing chamber is increased, and the plasma is generated in the processing chamber. Therefore, in order to achieve the balance with the generated plasma, a minus bias voltage is generated on the wafer W. This bias voltage oscillates in the minus voltage range.

Meanwhile, in the negative ion attraction process 3a, the source RF is turned OFF, so that the electron density is sufficiently decreased and the plasma becomes thin. Thus, the bias voltage is shifted to the zero-voltage baseline and oscillates between a plus voltage and a minus voltage with respect to the zero-voltage baseline (an upper graph of FIG. 5). Moreover, when the bias voltage has a plus value, the negative ions may be attracted to the target film of the wafer W. When the bias voltage has a minus value, the positive ions may be attracted to the target film of the wafer W.

Here, the effect of the negative ions attracted to the target film of the wafer W in the negative ion attraction process 3a will be described.

Figure 6:
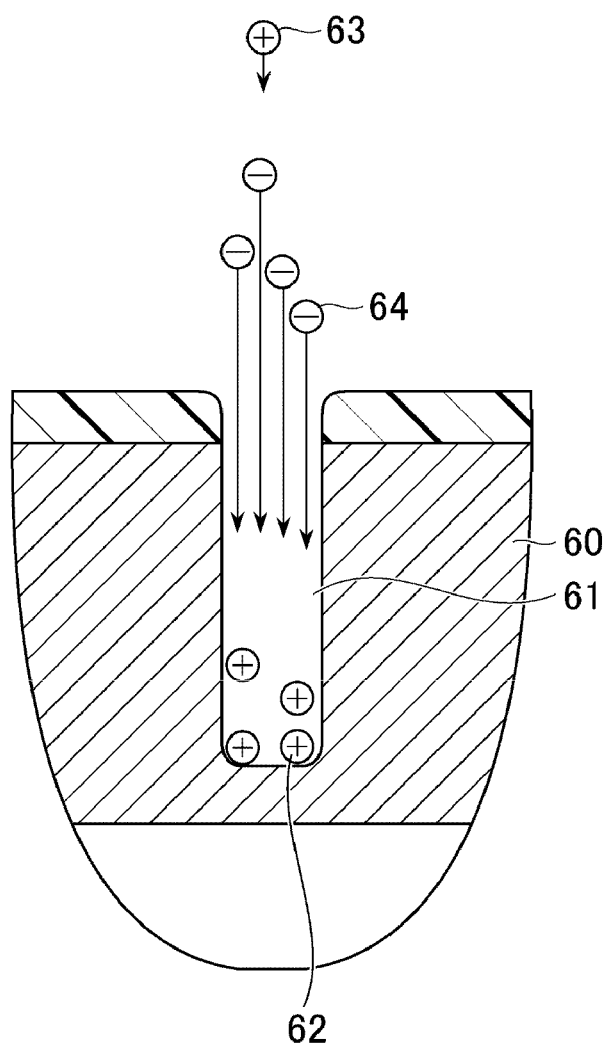
FIG. 6 is an explanatory diagram showing the effect of negative ions in the embodiment of the present disclosure.
Figure 7:
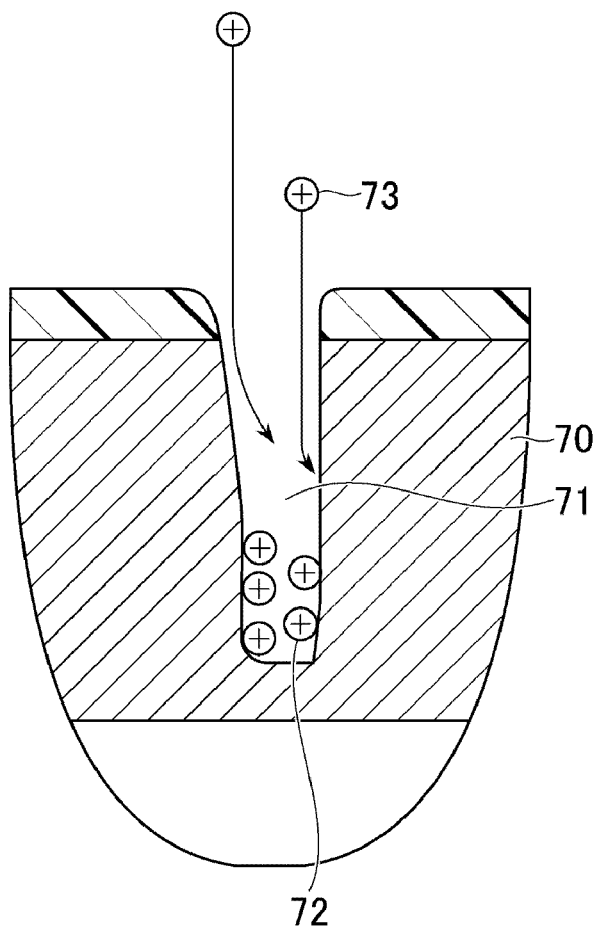
FIG. 7 is an explanatory diagram for describing a shading effect of positive ions in a conventional substrate processing method.

FIG. 6 is an explanatory diagram showing the effect of the negative ions in the present embodiment.

Referring to FIG. 6, as a result of the positive ion etching in the positive ion etching process 3b, positive ions 62 may remain at a bottom portion of the hole 61 formed in a target film 60 of the wafer W. If the positive ion etching continues in that state, positive ions 63 attracted to the target film 60 may be repelled by the positive ions 62 remaining at the bottom portion of the hole 61. As a consequence, the positive ion etching may not be smoothly carried out.

Meanwhile, the positive ions 62 remaining at the bottom portion of the hole 61 can be electrically neutralized by performing the negative ion attraction process 3a in which only the bias RF is turned ON prior to the positive ion etching process 3b in order to attract negative ions 64 in the processing chamber to the target film 60 of the wafer W.

If the plus charges in the target film 60 of the wafer W is electrically neutralized by the negative ions 64, the following positive ions 63 may easily enter the hole 61. Hence, the positive ion etching process 3b can be smoothly carried out.

As described above, in the present embodiment, upon completing the positive ion etching process 3b, the source RF and the bias RF are turned OFF and the electron temperature Te of the plasma is sufficiently decreased, so that negative ions are gradually generated in the processing chamber (negative ion generation process 3c). Next, only the bias RF is turned ON, so that the negative ions generated in the processing chamber 15 are attracted to the target film 60 (negative ion attraction process 3a). Thereafter, the source RF is turned ON, so that the high-efficiency etching by the positive ions is performed (positive ion etching process 3b). Then, the negative ion generation process 3c, the negative ion attraction process 3a and the positive ion etching process 3b are repeated in that order, thereby performing a predetermined etching process on the target film 60 of the wafer W.

In accordance with the present embodiment, the duty ratio of the bias RF is set to be, e.g., about 0.7 to about 0.8, desirably, about 0.75, and the duty ratio of the source RF is set to be, e.g., about 0.5 to about 0.6, desirably, about 0.5. By setting the duty ratio of the bias RF to be greater than that of the source RF, an etching time in the positive ion etching process can be sufficiently obtained after neutralizing the plus charges at the bottom portion of the hole by attracting the negative ions. Accordingly, the overall etching efficiency can be increased. In this case, frequencies of the pulse waves of the source RF and the bias RF are controlled to be same, e.g., about 1 kHz to about 20 kHz.

In the present embodiment, it is desirable that the positive ion etching process 3b continues for about ½ period of the pulse wave. Accordingly, the positive ion etching process can be performed for a sufficient time and the overall etching efficiency can be increased.

In the present embodiment, it is desirable that the negative ion generation process 3c continues for about ¼ period of the pulse wave or more. Accordingly, the negative ions can be surely generated and can be efficiently attracted to the target film of the wafer W in the negative ion attraction process 3a later.

In the present embodiment, the time during which the electron temperature within the processing chamber 15 decreases sufficiently and the negative ions are sufficiently generated may be, for example, about 10 μsec to about 30 μsec. Accordingly, it is desirable to perform the negative ion generation process 3c for about 10 μsec to about 30 μsec. That is, it is desirable that the negative ion generation process 3c is performed for about 10 μsec to about 30 μsec after the positive ion etching process 3b is ended by turning OFF the source RF and the bias RF. Then, the bias RF is turned ON and the negative ion attraction process 3a is performed. Accordingly, sufficient time for the negative ion generation can be obtained, and in the negative ion attraction process 3a later, the negative ions can be efficiently attracted to the hole 61 of the target film 60 of the wafer W to thereby neutralize the remaining positive ions 62.

In this case, the frequency of the bias RF is desirably set to be, for example, about 4 MHZ or less which does not contribute to plasma generation. Accordingly, the negative ions can be allowed to follow the changes of the bias frequency, so that the attraction efficiency of the negative ions can be improved. Further, the negative ion generation process 3c may continue for a certain time during which the plasma within the processing chamber becomes thin, the electron temperature decreases and the self-bias voltage approaches near a zero-voltage baseline from a minus value.

In the present embodiment, an apparatus that applies dual RF powers to the lower electrode is used as the substrate processing apparatus. However, the present invention is not limited to such a apparatus but can be applied to an apparatus that applies dual RF powers to the upper and lower electrodes, respectively.

While the above-described embodiment has been described as an example, the present disclosure is not limited to the above-described embodiment.

Further, in the above-described embodiment, the substrate subjected to the plasma process is not limited to the wafer for the semiconductor device, and various substrates for use in a FPD (Flat Panel Display) such as a LCD (Liquid Crystal Display), a photomask, a CD substrate or a print substrate can be used.

Further, the above-described embodiment can be implemented by providing a system or an apparatus with a storage medium storing therein a software program code for executing the above-described functions of each embodiment, and by reading and executing the program code stored in the storage medium by a computer (or a CPU or a MPU) of the system or the apparatus.

In this case, the program code itself read out from the storage medium may implement the functions of the above-described embodiments, and thus, the program code and the storage medium storing the program code may implement the above-described embodiments.

Further, by way of example, as a storage medium for storing the program code, a floppy (registered trademark) disc, a hard disc, a magneto-optical disc, an optical disc such as a CD-ROM, a CR-R, a CD-RW, a DVD-ROM, a DVD-RAM, a DVD-RW or a DVD+RW, a magnetic tape, a nonvolatile memory card, and a ROM can be used. Otherwise, the program code may be downloaded via a network.

The function of each embodiment can be implemented by executing the program code read by the computer, and an OS (operating system) operated on the computer may perform a part or all of the actual process in response to instructions of the program code and the function of each embodiment may be implemented by the process.

Further, the program code read from the storage medium may be written in a memory of a function extension board inserted into the computer or a function extension unit connected to the computer, and a CPU of the function extension board or the function extension unit may perform a part or all of the actual process in response to instructions of the program code and the function of each embodiment may be implemented by the process.

What is claimed is:

1. A substrate processing method performed by a substrate processing apparatus including a processing chamber for generating therein a plasma; a mounting table, provided in the processing chamber, for mounting thereon a substrate; and an electrode disposed to face the mounting table, the substrate processing method performing a plasma etching process on the substrate by applying to the processing chamber a first frequency power for generating plasma and applying to the mounting table a second frequency power for biasing, the second frequency power having a frequency lower than a frequency of the first frequency power, the substrate processing method comprising steps of:
applying the first frequency power and the second frequency power in the pattern of a pulse wave, respectively;
etching the substrate by positive ions in the plasma by applying both the first frequency power and the second frequency power;
generating negative ions in the processing chamber by stopping the application of both the first frequency power and the second frequency power; and
attracting the negative ions to the substrate by applying the second frequency power and stopping the application of the first frequency power,
wherein a duty ratio of the second frequency power is set to be greater than a duty ratio of the first frequency power,
the step of generating negative ions is started immediately upon completing the step of etching the substrate by positive ions by applying both the first frequency power and the second frequency power, and
another step of etching the substrate by positive ions by applying both the first frequency power and the second frequency power is started immediately upon completing the step of attracting the negative ions to the substrate.

2. The substrate processing method of claim 1, wherein the step of etching the substrate by positive ions, the step of generating negative ions, and the step of attracting the negative ions are repeated in that order.

3. The substrate processing method of claim 1, wherein the step of generating negative ions is performed for about ⅟4 period of the pulse wave or more.

4. The substrate processing method of claim 3, wherein the step of etching the substrate by positive ions, the step of generating negative ions, and the step of attracting the negative ions are repeated in that order.

5. The substrate processing method of claim 1, wherein the step of generating negative ions is performed for about 10 μsec to about 30 μsec.

6. The substrate processing method of claim 5, wherein the step of etching the substrate by positive ions, the step of generating negative ions, and the step of attracting the negative ions are repeated in that order.

7. The substrate processing method of claim 1, wherein the step of etching the substrate by positive ions and the another step of etching the substrate by positive ions are performed for about ½ period of the pulse wave or more.

8. The substrate processing method of claim 7, wherein the step of generating negative ions is performed for about ⅟4 period of the pulse wave or more.

9. The substrate processing method of claim 7, wherein the step of generating negative ions is performed for about 10 μsec to about 30 μsec.

10. The substrate processing method of claim 7, wherein the step of etching the substrate by positive ions, the step of generating negative ions, and the step of attracting the negative ions are repeated in that order.

11. The substrate processing method of claim 1, wherein the duty ratio of the second frequency power is about 0.7 to about 0.8, and the duty ratio of the first frequency power is about 0.5 to about 0.6.

12. The substrate processing method of claim 11, wherein the step of etching the substrate by positive ions and the another step of etching the substrate by positive ions are performed for about $1/2$ period of the pulse wave or more.

13. The substrate processing method of claim 11, wherein the step of generating negative ions is performed for about $1/4$ period of the pulse wave or more.

14. The substrate processing method of claim 11, wherein the step of generating negative ions is performed for about 10 μsec to about 30 μsec.

15. The substrate processing method of claim 11, wherein the step of etching the substrate by positive ions, the step of generating negative ions, and the step of attracting the negative ions are repeated in that order.

\* \* \* \* \*

UNITED STATES PATENT AND TRADEMARK OFFICE
CERTIFICATE OF CORRECTION

| | |
|---|---|
| PATENT NO. | : 8,685,267 B2 |
| APPLICATION NO. | : 13/165951 |
| DATED | : April 1, 2014 |
| INVENTOR(S) | : Koichi Yatsuda |

It is certified that error appears in the above-identified patent and that said Letters Patent is hereby corrected as shown below:

In the Specification

Column 3, line 35, please add "11" between - chamber - and - into -

Column 3, line 43, please add "14" between - plate - and - confines -

Column 4, line 28, please add "28" between - holes - and - is -

In the Claims

Column 10, line 42, please replace - /1;4 - with "1/4"

Column 10, line 57, please replace - /1;2 - with "1/2"

Column 10, line 59, please replace - /1;4 - with "1/4"

Column 11, line 8, please replace - /1;2 - with "1/2"

Column 11, line 11, please replace - /1;4 - with "1/4"

Signed and Sealed this
Twenty-second Day of July, 2014

Michelle K. Lee
*Deputy Director of the United States Patent and Trademark Office*